United States Patent [19]

Henn et al.

[11] Patent Number: 5,026,591
[45] Date of Patent: Jun. 25, 1991

[54] COATED PRODUCTS AND METHODS FOR MAKING

[75] Inventors: Robert L. Henn, Wilmington; Carol H. Morell, Hockessin, both of Del.; Edward J. Daniel, Landenberg, Pa.

[73] Assignee: W. L. Gore & Associates, Inc., Newark, Del.

[21] Appl. No.: 338,479

[22] Filed: Apr. 14, 1989

Related U.S. Application Data

[63] Continuation of Ser. No. 40,962, Apr. 21, 1987, abandoned.

[51] Int. Cl.$^5$ ............................ B32B 7/04; B32B 7/10
[52] U.S. Cl. ........................................ 428/198; 428/246; 428/284; 428/286; 428/315.5; 428/315.9; 428/422
[58] Field of Search ............... 428/198, 246, 284, 286, 428/315.5, 315.7, 315.9, 422

[56] References Cited

U.S. PATENT DOCUMENTS

| | | | |
|---|---|---|---|
| 3,941,633 | 3/1976 | Wang et al. | 156/77 |
| 3,953,566 | 4/1976 | Gore | 428/422 |
| 4,133,927 | 1/1979 | Tomada et al. | 428/422 |
| 4,187,390 | 2/1980 | Gore | 428/315.5 |
| 4,194,041 | 3/1980 | Gore et al. | 428/422 |
| 4,344,999 | 8/1982 | Gohlke | 428/316.6 |
| 4,443,511 | 4/1984 | Worden et al. | 428/422 |
| 4,532,316 | 7/1985 | Henn | 428/423.1 |
| 4,539,255 | 9/1985 | Sato et al. | 428/315.5 |
| 4,547,423 | 10/1985 | Kojima et al. | 428/315.9 |
| 4,613,544 | 9/1986 | Burleigh | 428/315.5 |
| 4,636,424 | 1/1987 | Amemiya et al. | 428/315.9 |
| 4,692,369 | 9/1987 | Nomi | 428/422 |

FOREIGN PATENT DOCUMENTS

| | | | |
|---|---|---|---|
| 0184392 | 6/1986 | European Pat. Off. | |
| 0211505 | 2/1987 | European Pat. Off. | 428/317.1 |
| 0238014 | 9/1987 | European Pat. Off. | |
| 1241228 | 8/1960 | France . | |
| 1213283 | 11/1970 | United Kingdom . | |
| 1254933 | 11/1971 | United Kingdom . | |
| 1310460 | 3/1973 | United Kingdom . | |
| 1339207 | 11/1973 | United Kingdom . | |
| 1493822 | 11/1977 | United Kingdom . | |
| 2024100 | 1/1980 | United Kingdom . | |
| 2131678A | 6/1984 | United Kingdom . | |

Primary Examiner—William J. Van Balen
Attorney, Agent, or Firm—Gary A. Samuels

[57] ABSTRACT

A coated product is provided and is comprised of a substrate and a coating comprised of a microporous scaffold having a high void volume and of open, interconnecting microstructure, the void being substantially filled with a chemical substance. The coating can be used by itself, or it can usefully be affixed to a wide variety of substrates. A method of making such products is also provided.

24 Claims, 3 Drawing Sheets

COATED PRODUCTS AND METHODS FOR MAKING

This application is a continuation of application Ser. No. 07/040,962, filed Apr. 21, 1987, now abandoned.

FIELD OF THE INVENTION

This invention provides a new form of coated products and a method for manufacturing them.

BACKGROUND OF THE INVENTION

Coated products have found uses in a wide variety of fields and have been produced by numerous processes. As used herein, a coated product is one in which a substrate is covered predominantly on a surface with one or more materials to give the substrate a property it does not possess by itself. These properties may include, but need not be limited to, chemical, physical, electrical, optical, and aesthetic. A coating is considered continuous when it imparts the prerequisite desired property to the coated product. For the purpose of this patent, continuous is thus defined in a functional sense. For example, if the coating is to provide the property of being waterproof, then it will be considered continuous if, under defined test conditions, it does not allow liquid water penetration. Similarly, depending on any other desired function, a coating will be considered continuous if it provides the desired properties, e.g. electrical conductivity, abrasion resistance, opacity, associated aesthetics or such other properties as defined by either an appropriate test method or end-use characterization. Certain applications require that the coating be free of pin-holes. One method of determining this is to subject the coating in question to a low pressure hydrostatic water challenge as described herein. If the coating passes this challenge it is considered to be continuous.

A useful summary of coating processes is found in the Kirk-Othmer Encyclopedia of Chemical Technology, Volume 6, pages 387–426 (1979 Wiley). Additional useful information may be found also in volume 10, pages 216–246.

Continuous coatings have been produced by two types of film forming processes:

(1) The formation of the film and attachment of the film to the substrate occur simultaneously; and (2) The film is formed independently, followed by attachment to the substrate, in separate distinct stages.

Coating techniques wherein film forming and combination with the substrate occur simultaneously are universally characterized by the exertion of hydraulic pressure by the liquid coating. This pressure which causes the film formation also causes penetration of the coating into the substrate which can lead to a non-supple, poor drape product. Where this is not desirable, a delicate balance must be maintained through control of the variables, including the incoming substrate, the coating rheology and surface tension, and the coating station design and operation. Such methods are undesirable as they require extensive operator control, are difficult to run, and thus may be operationally expensive.

Controlling the penetration of the substrate by the liquid coating while causing quality film formation can be achieved by optimizing all variables, which is at best a compromise of these variables. For instance, the substrate may be modified to cause more resistance to coating penetration. However, the modifications, known in the art, compromise properties such as adhesion of the coating, decreased drape and suppleness of the substrate, lost permeability through the substrate, and the added cost of additional processing steps prior to coating. These modifications in substrate are generally made and further compromises a range of substrates already limited in selection by those having appropriate characteristics facilitating the above coating methods.

The art teaches modification in the coating via controlling the rheology and surface tension to prevent penetration of the substrate. The range of acceptable coatings is thus further narrowed as these compromises may have deleterious results such as decreased adhesion.

Fortunately, the art has been developed to allow for a variety of techniques which have opened the window for a broader range of substrates and coatings of various chemistries that can be used for coated products by this family of coating techniques. In general, these coating processes have been designed to control and minimize the hydraulic forces causing the film penetration into the substrate. However, a balancing of interactions is still required to various degrees and, as stated, frequently results in compromises being made. Thus, coated products made by the techniques of film forming and simultaneous combination with the substrate are limited in scope to the tighter, smoother substrates and to those coating chemistries that allow for a medium range of viscosities.

These coating techniques further limit the possible substrates when a thin, continuous coating is desired. If the substrate has any substantial texture to it, then in order to insure continuity, thicker coatings must be applied or vice versa. If a thin coating is desired for functional reasons, a smooth substrate must be selected. Furthermore, an open substrate proves very difficult, if not impossible to coat.

More versatility in selection of the substrate is allowed when film formation is done prior to combination with the substrate. These processes, however, require specific rheological characteristics of the chemistry employed, which limit the candidate coating chemistries utilized. Furthermore, these processes require expensive equipment and are more frequently seen in volume-driven businesses and products. The performance requirements of the equipment and the chemistry become increasingly more exacting as the thickness of the coating is decreased. In addition, these processes still exhibit a tradeoff between adhesion of the coating to the substrate and penetration of the coating into the substrate.

Films formed by these techniques are frequently laminated to the substrate, rather than combined directly after film forming. This is particularly true where the films are desired to be thin and continuous so as to avoid any disruption of the integrity of the film. Lamination, as the term is used in this patent, requires having films formed in isolation and subsequently affixing them to a substrate. Particularly in thin, continuous film requirements, films are frequently affixed to the substrate by a separate adhesive layer. In some cases this affixing step may be achieved by partially remelting, or otherwise reflowing, the surface layer of the film. This approach suffers from the same problems of adhesion, penetration, continuity, and control referred to earlier, particularly with thin films. Lamination furthermore has the deleterious requirement of further processing steps while still necessitating control of penetration of the adhesive layer into the substrate. Attempts, although none totally satisfactory, to open this window of trade offs are well known in the art and effort continues as such.

BRIEF DESCRIPTION OF THE INVENTION

This invention relates to a coated product comprising a substrate and a coating comprising a microporous scaffold material having a microstructure of open, interconnecting voids and a void volume of greater than 40% and a chemical substance. The coating is affixed to at least one face of the substrate. A second substrate may also be affixed to the coating. Both sides of a substrate may have the coating affixed. Multiple layers are also feasible.

The scaffold material may further have a void volume greater than 70% and preferably greater than 85%. The scaffold material may have a thickness of less than 100 microns, preferably less than 35 microns, and most preferably less than 20 microns. The scaffold material may be made of polymers (synthetic and natural), plastics and elastomers.

The substrate may be of a diverse selection. The substrate may consist of a fabric. The fabric may be woven or non-woven. The substrate may also be comprised of paper. The substrate may also be a scrim, mesh, or grid. In one embodiment the substrate is a porous polymer.

The chemical substance may be of a diverse selection. The chemical substance of the coating may be melt processible, thermoplastic, thermoset, solvated material, ultraviolet curable material, actinic radiation curable material, plastisol, permselective polymer, or other polymers which may be processed in liquid phase.

The coated article may be used in waterproof-breathable products, waterproof-breathable garments, shoes, or gloves. The coated article may also be used in a medical device and permselective membranes. The coated article also may have uses in but need not be limited to: tents, car and boat covers, awnings, canopies, window-coverings or packaging materials. The coated article also may be used in wire insulation, printed circuit boards, diapers, feminine hygiene products, luggage, release materials or liners.

A method of making the coated product is also provided comprising the steps of incorporating a chemical substance into the void spaces in a microporous scaffold material having interconnecting voids and a void volume of greater than 40% and affixing the scaffold material to a substrate.

DETAILED DESCRIPTION OF THE PRESENT INVENTION

Figure 1:
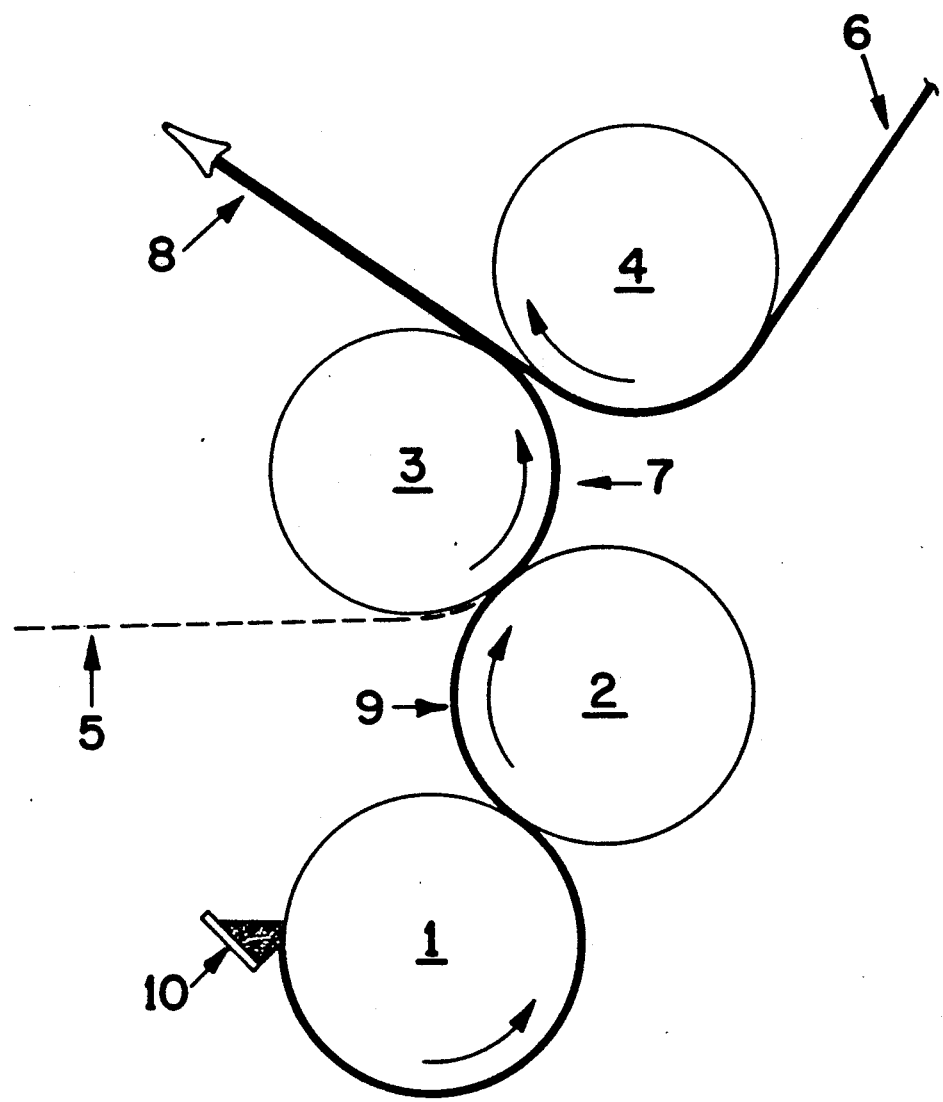
FIG. 1 is a schematic view of a four roll stack and illustrates one method of preparing the coated products of the invention.

The novel coated products of this invention and the process for producing the unique coated products according to the present invention will now be discussed in further detail.

A key to this invention is the utilization of a porous scaffold material to provide both processing benefits and surprising final product features in the coated product. The scaffold material is porous and is preferably selected to have a thickness approximately that of the final desired coating thickness. There are numerous examples of porous materials that may be utilized for the scaffold material.

A feature of this invention is the broad nature of materials that can be employed as the scaffold material. For example, they include polymers (synthetic and natural), plastics and elastomers. The limitation of the scaffold material is not believed to be bounded by the chemical nature of the material, or the method by which voids are created, but more by physical and structural characteristics.

Preferred scaffold materials are found to be microporous in nature. More specifically, the preferred scaffold materials have an open, interconnecting network of microscopic voids. In addition, the scaffold materials of this invention are found to have a high void volume, on the order of 40%, preferably in excess of about 70% void volume, and most preferably above 85% void volume. High void volume allows the chemical substance once substantially having filled the voids, to provide the chemistry of the final coating to approach that of the chemical substance, and not that of the scaffold material. The teachings of this invention do not limit the thickness of the scaffold material other than by the final desired thickness of the resultant coating. However, it has been found that the invention is more easily practiced with scaffold materials about 100 microns in thickness or less, preferably about 40 microns or less, and most preferably less than 20 microns. Void volume is determined from the physical dimensions, weight and density of the material making up the scaffold, using a light spring loaded micrometer to measure the thickness or other means which limits the crushing of the scaffold.

A preferred scaffold material is expanded PTFE. This material is characterized by a multiplicity of open, interconnecting voids, high strength, and stable chemical properties. It may be made according to the teachings of U.S. Pat. No. 3,953,566 and 4,187,390 and is further characterized by being expanded to exceptionally high void volumes and manufactured to uniform thickness.

Through utilization of the scaffold material the chemical substances employed in this invention can be very broad and diversified in nature. The singular known restraint is that the chemical substance be capable of being in a liquid phase during processing, more specifically, during application to the scaffold material. The chemical substances, being liquid, are thus capable of being placed into the void structure of the above described scaffold materials, substantially filling the same thereby providing a highly filled material such that the chemistry of the entirety is in essence that of the chemical substance. The chemical substances are selected primarily on the basis of the desired function they are to provide in the final coated product. The chemical substance after being placed in the scaffold material yields the final coating upon curing, reacting, drying or other means of solidification. When the scaffold material is highly porous and chemically passive, such as with expanded PTFE, the chemical substance is the predominant determinant of the chemical characteristics of the coating. As such, it is the chemical substance that provides for the functional properties of the coating.

To illustrate, but not limit the breadth of chemistries possible, suitable and satisfactory chemical substances include melt processable materials, solvated materials, UV or actinic radiation curable materials, plastisol materials, and other polymers or solutions of polymers in the liquid phase. Therefore, features in the final coating provided for by the chemical substance can be seen to range broadly in function such as, but not limited to waterproofness and breathability, conductivity, chemical selectivity, abrasion resistance, opactity, flame retardancy, high temperature properties, and flex properties.

Preferable chemical substances seem to be those having very little solvent or fugitive material and, even more preferable, to have a 100% conversion of liquid to solid after processing.

Given the breadth therefore of possibilities between scaffold material and chemical substances, some experimentation may be required to achieve the overall desired results. This might involve tailoring either the scaffold material, the chemical substance, or both, to achieve various end products and/or features. The following, however, will serve as a general guide to those skilled in the art who may wish to make a specific coated product.

A unique aspect of this present invention is the simplicity and versatility of the process. The chemical substance is placed into the voids of the scaffold material to form the coating which is then combined with the substrate. Then, depending on the mode of solidification of the chemistry utilized in the chemical substance, the chemical substance is allowed or caused to cure, react, gel, dry or solidify to provide the final coated product.

The chemical substance is delivered to the scaffold material in a controlled volume amount as required to fill or substantially fill the void volume of the porous scaffold material. The coating method, is illustrated but not limited to the following description of a four roll stack as illustrated in FIG. 1. Metered control of chemical substance is provided for by a gravure roll, 1, and doctor blade/feed reservoir, 10. The chemical substance, 9, is applied as a thin, continuous, liquid film to the continuously moving, scaffold material, 5, in the nip between two rotating rolls, 2 and 3; one such rotating roll, 2, having been coated with the chemical substance and the other such roll, 3, providing support so as to force the chemical substance into the porous structure of the scaffold material, 5. The coating, 7, (i.e. the scaffold material and chemical substance) is subsequently combined with the substrate, 6, in the nip between two rotating rolls, 3 and 4, resulting in the coated product, 8, of this invention. This method can be further modified to allow for a second substrate to be brought into the backside of the coating to cause a sandwich effect, the coating being between the two substrates. This process can also be utilized to allow for coating both faces of a substrate.

One of the many benefits of the present invention is the wide variety of substrates that can be processed into a coated product. This is true because the substrate does not control the film forming process, nor does the substrate's geometry, properties or characteristics control the penetration of coating into the substrate. The scaffold controls in a surprising way the amount of chemical substance entering and adhering to the substrate, and further controls in a unique way the geometry and the continuity of the coating, thus allowing for any substrate of any geometry (i.e. thickness, texture, openness, etc.) to be selected. The substrate, therefore, is selected predominantly as the needs of the end use requirement dictate.

Figure 2:
FIG. 2 is a photomicrograph of a coated product of the invention.

The coated products by this technique are seen to have a variety of unique characteristics. When looking at a photomicrograph, FIG. 2, of the materials provided for by this invention, it is found that the coating (the combination of chemical substance and scaffold material) is attached to the substrate in a unique way. Surprisingly, the coating and the substrate attach only at specific points. This is contrasted against what is normally seen in the prior art, FIG. 3, where the coating in general seems to follow the contour of the substrate and/or fill in the voids and valleys in the substrate and as such is seen to not have an overall regular thickness. This seems to be true regardless of chemical substance employed and regardless of the substrate employed and is insensitive to the pressures with which the substrates are married to the coating. The coating on a microscopic scale is seen to span between the points of contact of the substrate rather than follow the contours of the surface. What is further surprising is that the chemical substance affixing the coating layer to the substrate seems to be generally found in higher concentration at the point of contact of the coating layer and substrate.

Coatings of this invention can be very thin, frequently less than 25 microns, and still be exceptionally continuous in nature. These products provide exceptional drape properties, indeed the drape characteristics are substantially those of the original substrate. Thus, a thin, continuous coating can be applied to a wide variety of substrates adding functional properties, such as waterproofness, yet retaining all the desirable properties of the substrate, such as drape and aesthetics. By this means, coated products are obtained using a simple process and which are useful and could not previously be obtained by the prior art processes. Through proper selection of chemistry and substrate, whole families of unique coated products can be provided for.

This invention, through the utilization of a scaffold material, causes the substrate and chemical substance to be essentially independent of one another in making a coated product. Indeed the scaffold and its chemical substance can be used by itself as a useful product without affixing to a substrate. Both sides of a substrate may have this coating affixed to it or a coating may be sandwiched between two substrates. Multiple layers are also feasible. Due to the great versatility of this approach to creating coated products, many products are contemplated and in turn many applications are thus also contemplated. The coated products and applications are limited only by imagination, need and available materials.

It is contemplated that a thin, continuous coating of hydrophilic chemistry coated on an appropriate substrate might find utility in waterproof, breathable applications such as garments, vehicle covers, diapers, adult incontinent products, feminine hygiene products, protective clothing, medical barriers, shoe/glove materials, tents and the like.

Nor are the products of this invention limited to use in waterproof and breathable applications, but find uses where the drape, aesthetics and continuity are important. Such areas include awnings and canopies, wall and window coverings, liners and assembly materials, various insulation blankets, banners, packaging areas, inflatable assemblies and materials for localized environmental control. The present technology may be used in permselective membranes by selecting the appropriate chemical substance such as perfluorosulphonic acid or specifically designed polyurethanes. Further, by appropriate chemical substance selection conductive, non-conductive, high temperature, or other properties for use in the wire and cable industry are also produced by this technology. Coatings can be generated by this technology that are useful on their own (i.e. without the substrate) or in combination with other materials. These coatings are useful in the assembly of composites and as sheet adhesives. Applications taking advantage of features of plastics and elastomers in thin, continuous form will benefit from this technology. Other general applications contemplated include sterile packaging, sporting goods, polishing/abrasive cloths, bag liners, luggage and general covers, medical products, controlled release products, geo-textiles and geo-membrane products.

The following examples illustrate embodiments of the invention, but are not intended to limit the scope of the present invention.

TEST PROCEDURES

A variety of different tests have been used in the examples to demonstrate the functions added. These test procedures are described. It should be understood that any of these tests, or others, can be used as necessary. It is not a requirement that any or all of these tests be satisfied. The end use dictates the appropriate test.

GURLEY NUMBER DETERMINATION

Expanded PTFE was tested for Gurley Number, defined in this patent as the time in seconds for 100 cc of air to flow through 6.45 cm$^2$ of test material under a pressure drop of 1.2 kPa. The test device, a Gurley Densometer Model 4110, was employed in a method similar to Method A of ASTM D726-58. The expanded PTFE was clamped into the testing device with a reinforcing mesh screen (150 microns) under the test sample to prevent rupture of the test sample. Six test samples were employed.

BUBBLE POINT DETERMINATION

Expanded PTFE was tested for bubble point, defined in this patent as the pressure required to blow the first bubble of air detectable by its rise through a layer of liquid covering the sample. A test device, similar to the one employed in ASTM F316-80, was used consisting of a filter holder, manifold and pressure gauge (maximum gauge pressure of 275.8 kPa). The filter holder consisted of a base, a locking ring, an o-ring seal, support disk and air inlet. The support disk consisted of a 150 micron mesh screen and a perforated metal plate for rigidity. The effective area of the test sample was 8.0 plus or minus 0.5 cm$^2$.

The test sample was mounted on the filter holder and wet with anhydrous methanol until clarified. The support screen was then placed on top of the sample and the top half of the filter holder was tightened in place. Approximately 2 cm of anhydrous methanol was poured over the test sample. The pressure on the test sample was then gradually and uniformly increased by the operator until the first steady stream of bubbles through the anhydrous methanol were visible. Random bubbles or bubble stream of the outside edges were ignored. The bubble point was read directly from the pressure gauge.

MOISTURE VAPOR TRANSMISSION TEST

A description of the test employed to measure moisture vapor transmission rate (MVTR) is given below. The procedure has been found to be suitable for testing coatings and coated products.

In the procedure, approximately 70 mls of a saturated salt solution of potassium acetate and distilled water was placed into a 133 mls polypropylene cup, having an inside diameter of 6.5 cm at the mouth. An expanded PTFE membrane, having a Gurley number of about 7 seconds, a bubble point of about 179 kPa, thickness of about 37 microns and a weight of about 20 gms/m$^2$, available from W. L. Gore & Associates of Newark Delaware, was heat sealed to the lip of the cup to create a taut, leakproof, microporous barrier containing the salt solution. A similar expanded PTFE membrane was mounted taut within a 12.5 cm embroidery hoop and floated upon the surface of a water bath. The water bath assembly was controlled at 23° C. plus or minus 0.1° C., utilizing a temperature controlled room and a water circulating bath.

The sample for testing MVTR was cut to approximately a 7.5 cm diameter and was equilibrated in a chamber having a relative humidity of about 86 percent for a minimum of 4 hours. The sample was then placed face down onto the surface of the floating expanded PTFE membrane.

The cup assembly was weighed to the nearest 1/1000 gm and was placed in an inverted manner onto the center of the test sample.

Water transport was provided by the driving force between the water and the saturated salt solution providing water flux by diffusion in that direction. The sample was tested for 15 minutes and the cup assembly was then removed, weighed again to within 1/1000 gm.

The MVTR of the sample was calculated from the weight gain of the cup assembly and was expressed in grams of water per square meter of sample surface area per 24 hours.

A second cup assembly was simultaneously weighed to within 1/1000 gm and placed onto the test sample in an inverted manner as before. The test was repeated until a steady state MVTR was observed by two repetitive MVTR values. With thin coatings (less than 0.25 mm), this generally has been found to require only one test interval to achieve steady state information within the variability of the test.

CONTINUITY TEST

Coated products of the present invention were tested for coating continuity using a modified Suter test apparatus, which is a low water entry pressure challenge. Water was forced against a sample of 10 cm diameter sealed by two rubber gaskets in a clamped arrangement. The sample was mounted with the coating side down against the water. It is important that a leakproof seal is formed by the clamp mechanism, gaskets and sample. In deformable samples, the sample was held in place by a reinforcing scrim (e.g. open nonwoven). The sample was open to atmospheric conditions and was visible to the operator. The water pressure on the sample was increased to 6.89 kPa by a pump connected to a water reservoir, as indicated by an appropriate gauge and regulated by an in line valve. The test sample was at an angle and the water was recirculating to assure water contact and not air against the sample's lower surface. The upper surface of the sample was visually observed for a period of at least 1 minute for the appearance of any water which would be forced through the sample. Liquid water seen on the surface was interpreted as a deficiency in the continuity of the coating. A passing grade was given for no liquid water visible within 1 minute, thus indicating a continuous coating as defined for the desired function of waterproofness.

ABRASION RESISTANCE

The abrasion data presented in the examples was generated by using the Universal Wear Abrasion Test (Federal Test Standard No. 191A, Method 5302). Using a 0.45 kg weight, 10.3 kPa air pressure and an abradant of 101.8 gm/m$^2$ woven substrate of Taslan® yard, a looped, entangled nylon yarn from E. I. duPont Nemours, Inc., the number of abrasion cycles elapsed until the sample failed the coating continuity test was determined.

CONDUCTIVITY TEST

The conductive coated product of Example 5H was tested for conductivity by measuring volume resistivity with a test device similar to that employed in ASTM D257-78. The testing apparatus consisted of two parallel plates. Each plate had a pair of copper electrodes, 7.5 cm apart. The parallel plates were adjusted so that when the device was clamped the electrodes were vertically aligned. The test sample was prepared to a width of 1.25 cm and a length of 7.5 cm. It was mounted in the gap between the two platforms and clamped into place by activating the clamping mechanism. The clamping mechanism maintained 344.5 kPa pressure during testing. Once the sample was clamped into place, volume resistivity was measured using an ohm meter connected to the four copper electrodes.

MULLEN BURST TEST

The coated product of Example 1 was evaluated for waterproofness by the Mullen Burst Test (Federal Standard 191, Method 5512). The coated product was tested with the substrate on the low pressure side and the coating on the high pressure side to determine the burst pressure or pressure at which the coated product of the invention commenced leakage.

EFFECTIVE COATING THICKNESS MEASUREMENT

To determine the effective coating thickness of coated products, a photomicrograph was taken of a cross-sectional slice of the test sample. Typically, a 500× magnification of the cross-sectional slice was used. At this magnification, the effective coating was visually determined to be the area that is seen to span between the points of contact with the substrate. The thickness of this area was measured manually using the reference bar on the photomicrograph and reported in microns.

FIRE RETARDANCY TEST

Flammability testing of coated products was performed using a method according to Federal Standard Test Method 5903. This method determines the resistance of the test sample to flame and determines the after flame time, the after glow time and char length.

A suitable, unwashed test sample was aligned in the test holder to be smooth and taut. The sample holder was positioned above a gas burner in a ventilated chamber. The gas pressure was adjusted so that the flame reached the top of the indicator. The test was started by exposing the test sample to a flame for 12 seconds. During this time the operator recorded the time that the sample continued to burn after the igniting flame was extinguished. An after flame reading of 2 seconds or less was considered passing. The time of after glow was determined by observing the time the material glowed after flaming ended. An after glow reading of 2 seconds or less was considered passing. Once the sample stopped glowing, the operator removed it from the holder placing it flat on a countertop. The sample was folded lengthwise through the high point of the char. The sample was then torn by clamping the charred end to a lightweight scale. The char length was determined by measuring the distance between the sample edge and the tip of the tear. A char length of 10 cm or less was considered passing.

EXAMPLE 1

A coated product was made in accordance with the present invention using the apparatus shown in FIG. 1. A roll coater was used in a 0.425 m, 4-roll stack configuration, in line with a tenter frame and take-up. The stack comprised of a gravure roll, quadrangular pattern, 33 cells per centimeter, cell depth of 110 microns (33Q/110), nipped at 275.6 kPa to a Viton® (fluoroelastomer available from duPont) rubber roll of 90 durometer, nipped at 137.8 kPa to a chrome roll, nipped at 137.8 kPa to a silicone rubber roll of 60 durometer. The gravure roll was heated to 100° C. and the chrome to 85°-90° C.; the rubber rolls in contact also were at an elevated temperature. The gravure roll was in contact with a trough containing a reactive hot melt, hydrophilic polyurethane prepared according to the teachings of U.S. Pat. No. 4,532,316. The melt viscosity of said chemical substance was approximately 5000 cps as measured on a rheometer using parallel oscillating discs at the application temperature of 100° C. The chemical substance transferred from the gravure roll along the stack until it came in contact with the scaffold material. The scaffold material was expanded PTFE prepared according to the teachings of U.S. Pat. No. 3,953,566 and 4,187,390, having a void volume of about 87%, an overall thickness of about 18 microns and a weight of about 6 gm/m$^2$. The coating (i.e. combination of scaffold and chemical substance) was brought into contact with a 142.5 gm/m$^2$, 50%/50% polyester/cotton woven substrate at the chrome roll/silicone roll nip. The coated product thus made then went from the nip to the tenter frame, passing through a water spray to the take-up. The coated product was then cured under ambient conditions for 48 hours. The final properties of the coated product are listed in Table 1. All properties were characterized by the appropriate tests described above.

TABLE 1

| PROPERTIES OF COATED PRODUCT OF EXAMPLE 1 | |
|---|---|
| TOTAL WEIGHT: | 148.6 GMS/M$^2$ |
| MVTR: | 21200 GMS/M$^2$/ 24 HOURS |
| TOTAL THICKNESS: | 0.31 MM |
| MULLEN'S BURST TEST: | 434.1 KPA |
| EFFECTIVE COATING THICKNESS | 4-5 MICRONS |

TABLE 1-continued

PROPERTIES OF COATED PRODUCT OF EXAMPLE 1

COATING CONTINUITY TEST: PASS

EXAMPLE 2

This example is to illustrate the uniqueness of the coated products of this invention compared to a coated textile of the prior art.

Figure 3:
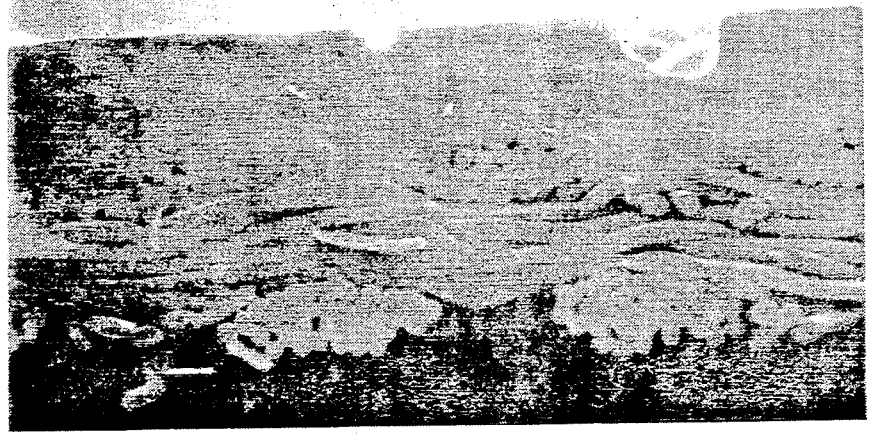
FIG. 3 is a photomicrograph of a prior art coated product.

A prior art technology was disclosed in U.S. Pat. No. 4,532,316, Example 10 and is used by way of further illustrating this invention. FIG. 3 is a photomicrograph of the coated textile of the above cited reference prepared via a transfer coating method wherein film forming and combination with the substrate are in separate stages, and the polymer film was combined with the textile fabric via the exertion of controlled hydraulic pressure. As can be seen in FIG. 3, the coating is found to have both thick and thin areas of greatly different magnitude. The thin areas are caused by the high spots of the textile and create a threat to continuity of the coating as referenced earlier. The coating is not seen to span the high spots, rather it fills in the gaps between. The contrast between FIGS. 3 and FIG. 2 clearly shows a distinction between the present invention and the prior art.

EXAMPLE 3

Figure 4:
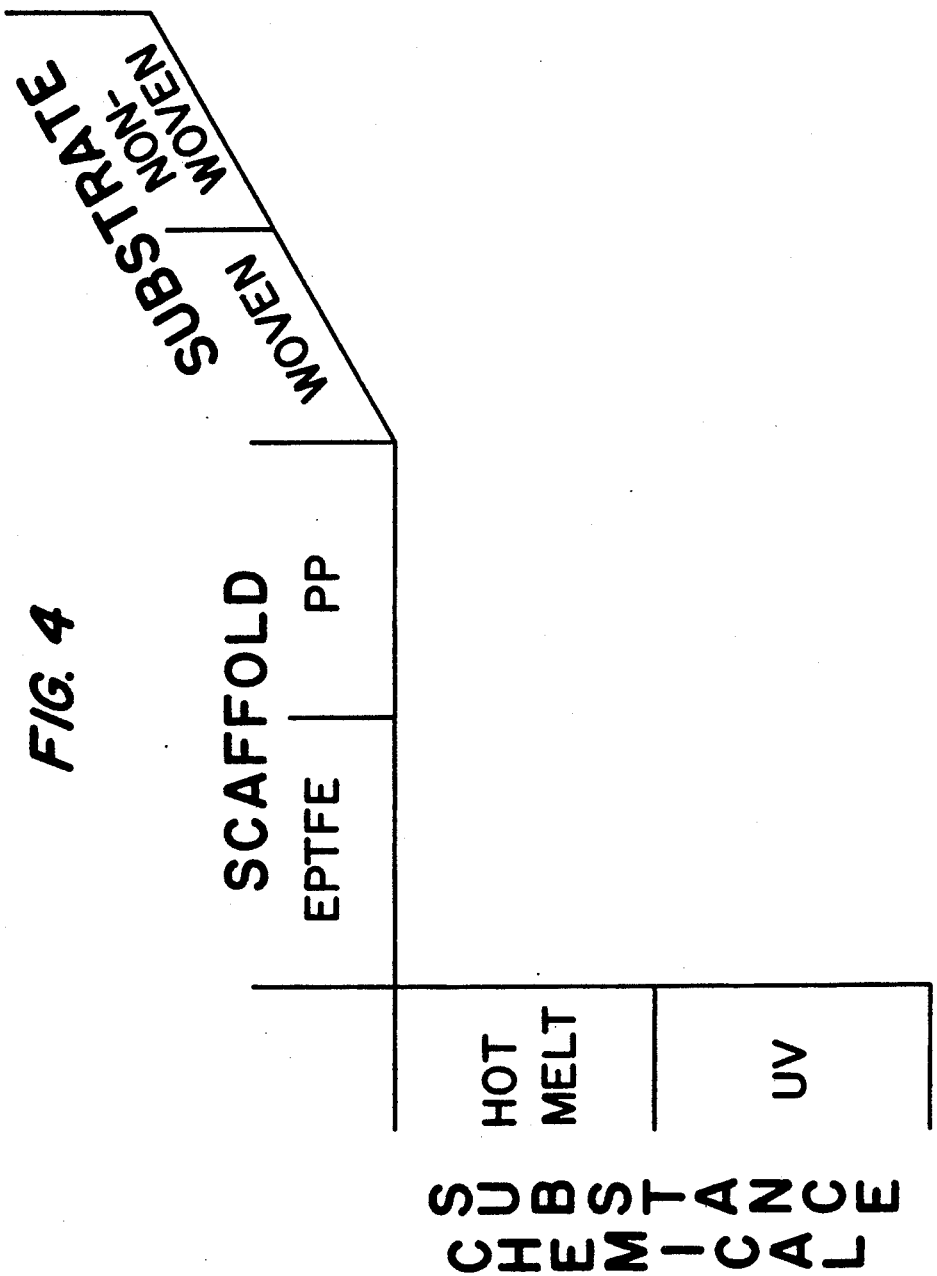
FIG. 4 is an illustration of the materials used in Example 3.

To demonstrate the versatility of the invention, a $2^3$ factorial experiment design was performed using the various substrates, chemistries and scaffold materials. (see FIG. 4) The materials used were:

Substrates

1. Woven: A woven polyester/cotton blend (102–143 gm/m$^2$)
2. Nonwoven: Spunbonded polyamide nonwoven (10 gm/m$^2$)

Chemical Substances

1. Hot Melt: Reactive, hot melt, hydrophilic polyurethane of Example 1
2. UV: Hydrophilic polyurethane acrylate of Example 5B

Scaffold Materials

1. EPTFE: Expanded polytetrafluoroethylene (manufactured according to U.S. Pat. No. 3,953,566, and 4,187,390; ca void volume=87%, ca thickness=7 microns, ca weight 6 gm/m$^2$).
2. PP: Microporous polypropylene (available under the trade name Celgard ® 2500; ca void volume=45%, ca thickness=25 microns, ca weight=10 gm/m$^2$).

EXAMPLE 3A

A woven 50%/50% polyester/cotton blend substrate was combined with the coating comprised of the hydrophilic, reactive hot melt polyurethane and the expanded PTFE scaffold material using the method described in Example 1, ambient cured for 48 hours, producing a final coated product whose properties appear in Table 3. Using the expanded PTFE as the scaffold material provided for pleasing aesthetics and a particularly pleasing drape in the final coated product.

EXAMPLE 3B

A woven 50%/50% polyester/cotton blend substrate was combined with the coating comprised of the hydrophilic, reactive hot melt polyurethane and the microporous polypropylene scaffold material using the method described in Example 1, ambient cured for 48 hours, producing a final coated product whose properties appear in Table 3.

EXAMPLE 3C

The spunbonded polyamide nonwoven substrate was combined with the coating comprised of the hydrophilic, reactive hot melt polyurethane and the expanded PTFE scaffold material using the method described in Example 1, without the water spray, ambient cured for 48 hours, producing a final coated product whose properties appear in Table 3.

EXAMPLE 3D

The spunbonded polyamide nonwoven substrate was combined with the coating comprised of the hydrophilic, reactive hot melt polyurethane and the microporous polypropylene scaffold material using the method of Example 1, substituting a gravure roll, having pyramid cells, 9.8 cells per centimeter, 236 micron depth per cell, (9.8P/236), and no water spray. Upon ambient cure for 48 hours, a final coated product was produced whose properties appear in Table 3.

EXAMPLE 3E

The spunbonded polyamide nonwoven substrate was combined with the coating comprised of the polyurethane-acrylate at 25°–30° C. and the expanded PTFE scaffold material using a method similar to Example 1 with the rolls at 25°–30° C., 275.6 kPa pressure between between all rolls, and 2 ultraviolet, 118 watt/cm mercury lamps in line, with no water spray. The chemical substance was solidified upon passing under the UV lamps, allowed to finish cure under ambient conditions for 48 hours, producing the final coated product whose properties appear in Table 3.

EXAMPLE 3F

A woven 70%/30% polyester/cotton blend substrate was combined with the coating comprised of the polyurethane acrylate at 25°–30° C. and the microporous polypropylene scaffold material using the method similar to Example 3E and with the 9.8P/236 gravure roll with 103, 551, and 69 kPa nip pressures betwen the gravure and rubber rolls, the rubber roll and chrome roll, the chrome roll and silicone rubber roll, respectively. The chemical substance was solidified upon passing under the UV lamps, allowed to subsequently ambient cure for 48 hours, producing a final coated product whose properties appear in Table 3.

EXAMPLE 3G

The spunbonded polyamide nonwoven substrate was combined with the coating comprised of the polyurethane-acrylate at 25°–30° C. and the microporous polypropylene scaffold material using the method described in Example 3F. The chemical substance was solidified upon passing under the UV lamps, allowed to subsequently ambient cure for 48 hours, producing a final coated product whose properties appear in Table 3.

EXAMPLE 3H

A woven 50%/50% polyester/cotton blend substrate was combined with the coating comprised of the polyurethane-acrylate at 25°-30° C. and the expanded PTFE scaffold material using a method similar to Example 3E with the rolls at 40°-45° C. with 276, 276, 413 kPa pressures between the gravure and rubber rolls, the rubber roll and chrome roll, the chrome roll and silicone rubber roll, respectively. The chemical substance was solidified upon passing under the UV lamps, allowed to subsequently ambient cure for 48 hours, producing a final coated product whose properties appear in Table 3.

polyurethane and the expanded PTFE of Example 1, and the nonwoven substrates to manufacture in a one run experiment a wide spectrum of coated products having a thin, continuous coating. These products were ambient cured for 48 hours to produce the final coated products whose properties appear in Table 4.

EXAMPLE 4A

In another experiment using the method of Example 1, three additional hand sample nonwoven substrates (numbers 30–32 from Table 3) were taped to the carrier taffeta and converted to coated products having a thin, continuous coating. These products were ambient cured for 48 hours to produce the final coated products whose properties appear in Table 4.

TABLE 3

| | SUBSTRATE | | CHEMISTRY | | SCAFFOLD | |
| --- | --- | --- | --- | --- | --- | --- |
| EXAMPLE | SPUNBONDED POLYAMIDE, NONWOVEN | POLYCOTTON BLEND WOVEN | HOT MELT HYDROPHILIC POLYURETHANE | POLYURE- THANE- ACRYLATE | EXPANDED PTFE | MICROPOROUS, POLYPROPYLENE |
| 3A | — | X | X | — | X | — |
| 3B | — | X | X | — | — | X |
| 3C | X | — | X | — | X | — |
| 3D | X | — | X | — | — | X |
| 3E | X | — | — | X | X | — |
| 3F | — | X | — | X | — | X |
| 3G | X | — | — | X | — | X |
| 3H | — | X | — | X | X | — |

| | COMPOSITE PROPERTIES | | | |
| --- | --- | --- | --- | --- |
| EXAMPLE | TOTAL COMPOSITE THICKNESS MM | MVTR GMS/M$^2$/24 HRS | COATING CONTINUITY TEST | COATING THICKNESS MICRONS |
| 3A | 0.32 | 21,175 | PASS | 4–5 |
| 3B | 0.49 | 9,321 | PASS | 25 |
| 3C | 0.14 | 21,700 | PASS | 4–5 |
| 3D | 0.15–0.17 | 12,858 | PASS | 24 |
| 3E | 0.10 | 22,841 | PASS | 4–5 |
| 3F | 0.35 | 7,869 | PASS | 30 |
| 3G | 0.13–0.14 | 8,947 | PASS | 24 |
| 3H | 0.35 | 13,400 | PASS | 22 |

EXAMPLE 4

To demonstrate the breadth of substrates useful in practicing the invention, twenty-nine different nonwoven substrates were placed (by means of masking tape) onto approximately 4.6 meters of 38 cm wide gray taffeta (47.5 gm/m$^2$) as a carrier web. Nonwoven samples were hand samples obtained either from the manufacturer's technical brochure or from a 1986 Inda conference brochure entitled "Nonwoven Classics".

Thus, according to the procedure outlined in Example 1 (gravure roll at 95° C.), the method of the invention was used with the reactive, hot melt hydrophilic

EXAMPLE 4B

In another experiment using the method of Example 1 without the water spray, several feet of 43 cm wide meltblown ethylene vinyl acetate substrate (101.8 gm/m$^2$) was combined with the reactive, hot melt polyurethane and the expanded PTFE scaffold material. The chemical substance was allowed to ambient cure for 48 hours, producing a coated product of suitable size whose properties appear in Table 4, Sample Number 33. This confirms that the failure of Number 18 in the continuous experiment was an anomaly.

TABLE 4

| SAMPLE NO. | SUBSTRATE DESCRIPTION | TOTAL COMPOSITE THICKNESS MM | MVTR GMS/M$^2$/24 HRS | COATING CONTINUITY TEST | COATING THICKNESS MICRONS |
| --- | --- | --- | --- | --- | --- |
| 1 | CARDED RAYON, RESIN BONDED (20.4 GM/M$^2$) | 0.12 | 23,200 | PASS | 4–5 |
| 2 | CARDED POLYESTER, PRINT BONDED (20.4 GM/M$^2$) | 0.13 | 22,200 | PASS | 8–14 |
| 3 | CARDED POLYPROPYLENE, THERMAL BONDED (23.8 GM/M$^2$) | 0.18 | 21,300 | PASS | 8–12 |
| 4 | CARDED RAYON, APERTURED, PRINT BONDED (54.3 GM/M$^2$) | 0.28 | 20,700 | PASS | 10–12 |
| 5 | FIBERFILL (64.5 GM/M$^2$) | 0.80 | 10,200 | PASS | 8–12 |
| 6 | SPUNLACE, POLYESTER PULP (71.3 GM/M$^2$) | 0.28 | 21,800 | PASS | 9–10 |
| 7 | DRY LAID PULP (64.5 GM/M$^2$) | 0.60 | 17,600 | PASS | 8–10 |
| 8 | WET LAID PACKAGING (17.0 GM/M$^2$) | 0.09 | 23,100 | PASS | 5–7 |
| 9 | WET LAID BARRIER (54.3 GM/M$^2$) | 0.18 | 19,500 | PASS | 5–6 |

TABLE 4-continued

| SAMPLE NO. | SUBSTRATE DESCRIPTION | TOTAL COMPOSITE THICKNESS MM | MVTR GMS/$M^2$/ 24 HRS | COATING CONTINUITY TEST | COATING THICKNESS MICRONS |
|---|---|---|---|---|---|
| 10 | WET LAID GLASS (64.5 GM/$M^2$) | 0.42 | 22,100 | PASS* | 8-9 |
| 11 | POLYETHYLENE, SPUNBONDED (81.5 GM/$M^2$) | 0.18 | 3,600 | PASS | 5-7 |
| 12 | POLYESTER, SPUNBOND, NEEDLED, COATED (257.9 GM/$M^2$) | 1.15 | 13,800 | — | 10-12 |
| 13 | POLYPROPYLENE SPUNBOND, THERMAL BONDED (23.8 GM/$M^2$) | 0.21 | 21,000 | PASS | 8-10 |
| 14 | MELTBLOWN (23.8 GM/$M^2$) | 0.15 | 25,600 | PASS | 5-6 |
| 15 | APERTURED FILM (20.4 GM/$M^2$) | 0.10 | 3,420 | PASS* | 5-6 |
| 16 | POLYETHYLENE, SPUNBONDED, PERFORATED (39.0 GM/$M^2$) | 0.13 | 4,000 | PASS | 5-6 |
| 17 | POLYETHYLENE, SPUNBONDED (39.0 GM/$M^2$) | 0.16 | 1,900 | PASS | 4-5 |
| 18 | ETHYLENE VINYL ACETATE, MELTBLOWN (101.8 GM/$M^2$) | ** | ** | ** | ** |
| 19 | TYVEK ® ENVELOPE (1 PLY) | 0.18 | 4,300 | PASS | 5-6 |
| 20 | RAYON, CHEMICALLY BONDED (23.8 GM/$M^2$) | 0.14 | 23,500 | PASS | 8-9 |
| 21 | COTTON, MECHANICALLY ENTANGLED (122.2 GM/$M^2$) | 1.00 | 13,500 | PASS | 5-6 |
| 22 | POLYESTER, CALENDARED, THERMAL BONDED (61.1 GM/$M^2$) | 0.08 | 4,700 | PASS | 5-7 |
| 23 | RAYON, PRINT BONDED (33.94 GM/$M^2$) | 0.14 | 23,800 | PASS | 5-10 |
| 24 | POLYESTER, SPUNLACED (57.7 GM/$M^2$) | 0.42 | 22,000 | PASS | 5-7 |
| 25 | 50% RAYON, 50% POLYESTER BLEND, SPUNLACED (50.9 GM/$M^2$) | 0.45 | 20,000 | PASS | 6-10 |
| 26 | POLYPROPYLENE, THERMAL BONDED (23.8 GM/$M^2$) | 0.18 | 21,600 | PASS | 6-8 |
| 27 | POLYESTER, THERMAL BONDED (39.0 GM/$M^2$) | 0.20 | 19,400 | PASS | 5-6 |
| 28 | 75% RAYON, 25% POLYPROPYLENE BLEND, THERMAL BONDED (88.2 GM/$M^2$) | 0.55 | 17,900 | PASS | 8-10 |
| 29 | 75% RAYON, 25% POLYPROPYLENE BLEND, THERMAL BONDED (122.2 GM/$M^2$) | 0.55 | 18,100 | PASS* | 7-8 |
| 30 | POLYAMIDE, SPUNBONDED (10.2 GM/$M^2$) | 0.14 | 21,700 | PASS* | 4-5 |
| 31 | 50% RAYON, 50% ETHYLENE-OCTENE COPOLYMER BLEND, SPUNLACED | 0.32 | 21,900 | PASS | 6-8 |
| 32 | POLYURETHANE, SPUNBONDED (108.6 GM/$M^2$) | 0.35 | 22,200 | PASS | 8-10 |
| 33 | ETHYLENE VINYL ACETATE, MELTBLOWN (101.8 GM/$M^2$) | 0.14-0.18 | 980 | PASS | 4-5 |

*PASSED WITH NONWOVEN SCRIM TO PREVENT RUPTURE.
**SEE 33.

EXAMPLE 5

To demonstrate the further versatility of the invention, various chemical substances were employed with the expanded PTFE scaffold material and appropriate substrates to produce coated products.

EXAMPLE 5A

The spunbonded polyamide nonwoven substrate (10.2 gm/$m^2$) was combined with the coating comprised of the reactive, hot melt hydrophilic polyurethane of Example 1 and the expanded PTFE scaffold material using the method described in Example 1, without the water spray. The chemical substance was allowed to ambient cure for 48 hours, producing a final coated product which passed the coating continuity test and had a total thickness of 0.138 mm, a MVTR of 21,700 gm/$m^2$/24 hrs. and an effective coating thickness of 4-5 microns.

EXAMPLE 5B

A hydrophilic polyurethane-acrylate composition was prepared from 233.4 gm (1.8672 molar equivalents) of 4,4'-diphenylmethane diisocyanate, 82.4 gm (0.9329 molar equivalents) of 1463 molecular weight polyoxyethylene glycol and 101.8 gm (0.7069 molar equivalents) of 1,4-butandediol monoacrylate, using 152.7 gm (15% pbw of formulation) N-vinyl-pyrrolidone as reactive diluent, 0.17 gm (1.7 ppm of formulation) phenothiazine as thermal stabilizer, 30.534 gm (3% parts by weight of formulation), Irgacure ® 500 available from Ciba-Geigy (understood to be a 50%/50% eutectic mixture of benzophenone and 1-hydroxyphenylcyclohexyl phenyl ketone), as photoinitiator using the following procedure:

The polyoxyethylene glycol at 80° C. was charged into the 1 liter jacketed resin kettle at 80° C. and the entire flask was evacuated with vacuum for at least two hours with stirring to degas and remove moisture. The vacuum was then broken and replaced with a dry nitrogen purge. The flaked 4,4'-diphenylmethane diisocyanate was charged into the stirred 80° C. reaction vessel. The theoretical percent isocyanate was generally reached within two hours after the addition of the isocyanate as determined by a standard dibutylamine titration (ASTM D2572-80). The isocyanate terminated polyoxyethylene so obtained was evacuated with vacuum and purged with dry air. With increased stirring the reaction was cooled to 45° C. The N-vinyl pyrrolidone was charged to the reaction at 45° C. An immediate viscosity reduction was observed. Immediately following the N-vinyl pyrrolidone addition the reaction was cooled further to 35° C. The phenothiozine and the 1,4-butandediol monoacrylate were charged into the reaction which was maintained at 35° C. overnight (18 hours). The theoretical percent isocyanate was checked by a standard dibutylamine titration method and was found to be in agreement with the theoretical value. The Irgacure ® 500 was blended into the acrylate-capped prepolymer just before discharge into amber, low density polyethylene containers. Storage of these containers at 30° C. maintained the polyurethane-acrylate in a low, viscosity, liquid form.

Thus, the spunbonded polyamide nonwoven substrate (10.2 gm/m$^2$) was combined with the coating comprised of the above described polyurethane-acrylate at 25°-30° C. and the expanded PTFE scaffold material using the method similar to Example 1 with the rolls at 25°-30° C., and 276 kPa pressure throughout the stack, and 2 ultraviolet, 118 watt/cm mercury lamps in line, with no water spray. The chemical substance was solidified upon passing under the UV lamps, allowed to subsequently ambient cure for 48 hours, producing the final product having a total thickness of 0.1 mm, an MVTR of 22,800 gm/m$^2$/24 hrs., an effective coating thickness of 4-5 microns and which passed the continuity test with reinforcing scrim.

EXAMPLE 5C

The spunbonded polyamide nonwoven substrate (10.2 gm/m$^2$) was combined with the coating comprised of a PVC plastisol and the expanded PTFE scaffold material using the method similar to Example 1 with the rolls at ambient temperature and 137.8, 68.9, 68.9 kPa between the gravure and rubber rolls, the rubber roll and chrome roll, the chrome roll and silicone rubber roll, respectively, to a tenter frame with an infrared oven set at about 160° C. The chemical substance was fused in the oven, producing a final coated product which passed the continuity test and had a total thickness of 0.138 mm, an MVTR of 90 gm/m$^2$/24 hrs., and an effective coating thickness of 12 microns.

EXAMPLE 5D

The spunbonded polyamide nonwoven (10.2 gm/m$^2$) substrate was combined with the coating comprised of a solvated polyurethane prepolymer made (as is well known in the art) by capping a poly(tetramethylene oxide) glycol with 4,4'-diphenylmethane diisocyanate, (80% solids, 20% xylenes) and the expanded PTFE scaffold material using the method of Example 5C, without the infrared ovens. The chemical substance was allowed to dry and ambient cure for 48 hours, producing a final coated product having a total thickness of 0.113 mm, an MVTR of 1,600 gm/m$^2$/24 hrs., an effective coating thickness of 10 microns, and which passed the continuity test.

EXAMPLE 5E

The spunbonded polyamide nonwoven (10.2 gm/m$^2$) substrate was combined with the coating comprised of a reactive hot melt, polyurethane having a poly(tetramethylene oxide) glycol backbone and prepared according to the teachings of U.S. Pat. No. 4,532,316, Example 3 and the expanded PTFE scaffold material using the method described in Example 1 substituting a 9.8P/236 gravure roll and no water spray. The chemical substance was allowed to ambient cure for 48 hours, producing a final coated product having a total thickness of 0.158-0.168 mm, a MVTR of 1,200 gm/m$^2$/24 hrs., an effective coating thickness of 9-10 microns, and which passed the continuity test.

EXAMPLE 5F

The spunbonded polyamide nonwoven (10.2 gm/m$^2$) substrate was combined with the coating comprised of a reactive hot melt polyurethane having a polycaprolactone diol backbone and made according to the teachings of U.S. Pat. No. 4,532,316, and the expanded PTFE scaffold material using the method of Example 5E. The chemical substance was allowed to ambient cure for 48 hours, producing a final coated product which passed 50 abrasion test cycles, and passed the coating continuity test, and had a total thickness of 0.155-0.163 mm, and having an effective thickness of 12-14 microns.

EXAMPLE 5G

A pajama check substrate woven of Nomex TM flame retardant aramid yarn in a ripstop-like pattern was combined with the coating comprised of the reactive, hot melt polyurethane of Example 5F and the expanded PTFE scaffold material using the method of Example 1 with a 120° C. gravure roll and no water spray. The chemical substance was allowed to ambient cure for 48 hours, producing a final coated product having a total thickness of 0.295-0.305 mm, an effective coating thickness of 5 microns, and which passed both the fire retardancy test and the coating continuity test.

EXAMPLE 5H

A polyester, carbon fiber conductive nonwoven (10.2 gm/m$^2$) substrate was combined with the coating comprised of a semi-conductive polyvinyl chloride (obtained from Scientific Materials Corporation) solvated in methyl ethyl ketone (36% solids, 64% MEK) and the expanded PTFE scaffold material using the method of Example 5C without the infrared oven. The chemical substance was allowed to dry for 24 hours to produce a final coated product having a conductivity of 99 ohms/square, a total thickness of 0.095-0.105 mm, and an effective coating thickness of 3-4 microns. Due to the small sample size, a 2.5 cm diameter low water entry pressure challenge test was conducted, a passing grade at 6.89 kPa for 1 minute was achieved.

EXAMPLE 6

To further demonstrate the versatility of the invention, various woven substrates were combined with the coating comprised of the reactive hot melt hydrophilic polyurethane of Example 1 and various scaffold materials to produce final coated products.

EXAMPLE 6A

The roll coater of Example 1 was used in a 4-roll stack configuration. The stack comprised of a gravure roll, nipped at 275.6 kPa to the Viton roll, nipped at 689 kPa to the chrome roll, nipped at 137.8 kPa to the silicone roll. The gravure roll was heated to 90°-95° C. and the chrome to 115°-120° C., the rubber rolls in contact were also at an elevated temperature. The gravure roll was in contact with a trough containing the reactive hot melt, hydrophilic polyurethane chemistry of Example 1, the melt viscosity of said chemical substance being approximately 2500 cps as measured on a rheometer using parallel oscillating discs at the application temperature of 95° C. The scaffold material was expanded PTFE prepared according to the teachings of U.S. Pat. No. 3,953,566, having a void volume of about 70%, an overall thickness of about 25 microns and a weight of about 16.4 gm/m$^2$. The coating (i.e. the combination of scaffold and chemical substance) was brought into contact with the woven substrate which was a Taslite ® woven fabric (a woven fabric of about 84.9 gm/m$^2$ of Taslan yarn), 108.6 gm/m$^2$ at the chrome roll/silicone nip. The coated product thus made was then cured ambiently for 48 hours, producing a final coated product having a total thickness of 0.23 mm, an MVTR of 14,500 gm/m$^2$/24 hrs., an effective coating thickness of 22 microns, and which passed the coating continuity test.

EXAMPLE 6B

A woven 50%/50% polyester/cotton blend substrate (142.5 gm/m$^2$) was combined with the coating comprised of the reactive, hot melt hydrophilic chemistry and the microporous polypropylene scaffold material of Example 3 using the method described in Example 1. The chemical substance was allowed to ambient cure for 48 hours, producing a final coated product having a total thickness of 0.48 mm, a MVTR of 9,300 gm/m$^2$/24 hrs., an effective coating thickness of 25 microns, and which passed the continuity test.

EXAMPLE 6C

A taffeta woven substrate (64.5 gm/m$^2$) was combined with the coating comprised of the reactive hot melt hydrophilic chemistry of Example 1 and a microporous polyethylene scaffold material (available from Millipore Corporation) having a void volume of 89%, a reported mean bubble point of ca 231.5 kPa, a thickness of ca 17.8 microns, and a base weight of 4.2 gm/m$^2$. The chemical substance and described scaffold material were combined using the method of Example 1 with 275.6 kPa at the chrome roll to silicone roll nip. The chemical substance was allowed to ambient cure for 48 hours, producing a final coated product having a total thickness of 0.12 mm, a MVTR of 9329 gm/m$^2$/24 hrs., an effective coating thickness of 5 microns, and which passed the continuity test.

EXAMPLE 6D

A taffeta woven substrate (64.5 gm/m$^2$) was combined with the coating comprised of the reactive hot melt hydrophilic chemistry of Example 1 and a microporous polyethylene scaffold material (available from Millipore Corporation) having a void volume of ca 91%, a reported mean bubble point of ca 187.4 kPa, a thickness of ca 25.4 microns and a base weight of ca 4.8 gm/m$^2$. The chemical substance and the described scaffold material were combined using the method of Example 6C. The chemical substance was allowed to ambient cure for 48 hours, producing a final coated product having a total thickness of 0.125 mm, a MVTR of 7,609 gm/m$^2$/24 hrs., an effective coating thickness of 5 microns, and which passed the continuity test.

EXAMPLE 6E

A taffeta woven substrate (64.5 gm/m$^2$) was combined with the coating comprised of the reactive hot melt hydrophilic chemistry of Example 1 and a microporous polyethylene scaffold material (available from Millipore Corporation) having a void volume of ca 91%, a reported mean bubble point of ca 116.4 kPa, a thickness of ca 38.1 microns and a base weight of ca 5.3 gm/m$^2$. The chemical substance and the described scaffold material were combined using the method of Example 6C. The chemical substance was allowed to ambient cure for 48 hours, producing a final coated product having a total thickness of 0.125 mm, a MVTR of 7,096 gm/m$^2$/24 hrs., an effective coating thickness of 12 microns, and which passed the continuity test.

EXAMPLE 7

Release paper as the substrate was combined with the coating comprised of a reactive, hot melt polyurethane according to the teachings of U.S. Pat. No. 4,532,316, Example 1 and the expanded PTFE scaffold material using the method described in Example 1 of this patent with a 120° C. gravure roll and no water spray. After the 48 hour ambient cure, this product was found to have a total thickness of 0.015–0.0175 mm, an effective coating thickness of 5 microns.

EXAMPLE 8

Using the method and materials of Example 1, a sandwich is formed by combining an additional substrate with the coating.

EXAMPLE 8A

The woven 50%/50% polyester/cotton blend substrate was combined with the coating comprised of the reactive, hot melt hydrophilic polyurethane and the expanded PTFE scaffold material using the method described in Example 1. Before the coated product was taken-up, a single layer of spunbonded polyamide nonwoven (10.2 gm/m$^2$) was married onto the coating surface as the coated product wrapped onto the core. The chemical substance was allowed to ambient cure for 48 hours producing a coated product where the coating was sandwiched between the substrate and having a total thickness of 0.385 mm, a MVTR of 14,900 gm/m$^2$/24 hrs., an effective coating thickness of 10 microns, and which passed the continuity test.

EXAMPLE 8B

The woven 50%/50% polyester/cotton blend substrate was combined with the coating comprised of the reactive, hot melt hydrophilic polyurethane and the expanded PTFE scaffold material using the method described in Example 1. Before the coated product is taken-up, a single ply of thermally bonded polyester nonwoven (27.2 gm/m$^2$) was married onto the coating surface as the coated product wrapped onto the core. The chemical substance was allowed to ambient cure for 48 hours producing a sandwich having a total thickness of 0.368–0.465 mm, a MVTR of 17,900 gm/m$^2$/24 hrs., an effective coating thickness of 14–15 microns, and which passed the continuity test.

EXAMPLE 8C

The woven 50%/50% polyester/cotton blend substrate was combined with the coating comprised of the reactive, hot melt hydrophilic polyurethane and the expanded PTFE scaffold material using the method described in Example 1. Before the coated product was taken-up, loose cotton fiber flocking was married onto the coating surface as the coated product wrapped onto the core. The chemical substance was allowed to ambient cure for 48 hours producing a sandwich having a total thickness of 0.32 mm, a MVTR of 19,000 gm/m$^2$/24 hrs., an effective coating thickness of 10 microns, and which passed the continuity test.

EXAMPLE 8D

The woven 50%/50% polyester/cotton blend substrate was combined with the coating comprised of the reactive, hot melt hydrophilic polyurethane and the expanded PTFE scaffold material using the method described in Example 1. Before the coated product was taken-up, loose rayon fiber flocking was married onto the coating surface as the coated product wrapped onto the core. The chemical substance was allowed to ambient cure for 48 hours producing a sandwich having a total thickness of 0.318–0.325 mm, a MVTR of 20,500 gm/m$^2$/24 hrs., an effective coating thickness of 6 microns, and which passed the continuity test.

EXAMPLE 8E

The woven 50%/50% polyester/cotton blend substrate was combined with the coating comprised of the reactive, hot melt hydrophilic polyurethane and the expanded PTFE scaffold material using the method described in Example 1. Before the coated product was taken-up, a base-hydrolyzed starch-polyacrylonitrile graft copolymer was married onto the coating surface as the coated product wrapped onto the core. The chemical substance was allowed to ambient cure for 48 hours producing a 3-layer sandwich having a total thickness of 0.368–0.465 mm, a MVTR of 17,900 gm/m$^2$/24 hrs., an effective coating thickness of 5–6 microns, and which passed the continuity test.

We claim:

1. An article of manufacture comprising:
   (a) a substrate comprising a fabric having an irregular surface profile and
   (b) a preformed, continuous coating which comprises (i) a microporous scaffold material comprised of a microporous polymer selected from the class consisting of plastics and elastomers having a microstructure of interconnecting voids and a void volume of greater than 40% and (ii) a chemical substance comprising a thermoplastic or thermosetting resin.

said chemical substance being incorporated into the void spaces of said microporous scaffold material and substantially filling the void spaces; said coating being affixed to at least one face of said fabric substrate by adherence of the chemical substance to the substrate at specific points of contact between the coating and the irregular surface of the fabric substrate; the thickness of the coating being less than 35 microns.

2. The article of claim 1 in which a second substrate is affixed to said coating.

3. The article of claim 1 in which the scaffold has a void volume of greater than 70%.

4. The article of claim 3 in which a second substrate is affixed to said coating.

5. The article of claim 1 in which the scaffold has a void volume of greater than 85%.

6. The article of claim 5 in which a second substrate is affixed to said coating.

7. The article of claim 1 in which the scaffold material has a thickness of less than 20 microns.

8. The article of claim 2 in which the scaffold material has a thickness of less than 20 microns.

9. The article of claim 3 in which the scaffold material has a thickness of less than 20 microns.

10. The article of claim 4 in which the scaffold material has a thickness of less than 20 microns.

11. The article of claim 5 in which the scaffold material has a thickness of less than 20 microns.

12. The article of claim 6 in which the scaffold material has a thickness of less than 20 microns.

13. The article of claim 1 in which the scaffold material is PTFE.

14. The article of claim 1 in which the scaffold material is expanded PRFE.

15. The article of claim 1 in which the scaffold is polypropylene.

16. The article of claim 1 in which the scaffold is polyethylene.

17. The article of claim 1 in which the scaffold is selected from the group: polyamide, polycarbonate, polycarbonate, poly(ethylene terephthalate), polyester, polyacrylate, polystyrene, polysufone, and polyurethane.

18. The article of claim 1 in which the fabric substrate is non-woven.

19. The article of claim 1 in which the fabric substrate is woven.

20. The article of claim 1 in which the chemical substance is a permselective polymer.

21. The article of claim 1 in which the chemical substance is a perfluorosulphonic acid polymer.

22. An article of claim 1 in which both faces of said substrate are affixed to coatings.

23. An article of manufacture comprising a muliplicity of layers, each said layer comprising a substrate and a coating defined as in claim 1.

24. A method for making a coated product comprising:
   (a) incorporating a precursor of a chemical substance comprising a thermoplastic or thermosetting resin into the void spaces in a microporous scaffold material, and
   (b) affixing the scaffold material obtained in step a to a fabric substrate, said fabric having an irregular surface profile, in a manner that results in the scaffold material contacting the fabric substrate only at certain points of contact.

* * * * *